United States Patent
Lee

(10) Patent No.: US 9,214,912 B2
(45) Date of Patent: Dec. 15, 2015

(54) SWITCHED CAPACITOR CIRCUITS HAVING LEVEL-SHIFTING BUFFER AMPLIFIERS, AND ASSOCIATED METHODS

(71) Applicant: Massachusetts Institute of Technology, Cambridge, MA (US)

(72) Inventor: Hae-Seung Lee, Lexington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 14/684,023

(22) Filed: Apr. 10, 2015

(65) Prior Publication Data

US 2015/0222238 A1 Aug. 6, 2015

Related U.S. Application Data

(63) Continuation of application No. PCT/US2013/064999, filed on Oct. 15, 2013.

(60) Provisional application No. 61/712,838, filed on Oct. 12, 2012.

(51) Int. Cl.
| | |
|---|---|
| *H03M 1/36* | (2006.01) |
| *H03G 3/00* | (2006.01) |
| *H03F 3/00* | (2006.01) |
| *H03F 3/45* | (2006.01) |
| *H03M 1/12* | (2006.01) |

(52) U.S. Cl.
CPC ............... *H03G 3/008* (2013.01); *H03F 3/005* (2013.01); *H03F 3/45179* (2013.01); *H03M 1/1245* (2013.01); *H03M 1/362* (2013.01); *H03F 2200/129* (2013.01); *H03F 2203/45156* (2013.01)

(58) Field of Classification Search
CPC .... H03G 3/008; H03M 1/362; H03M 1/1245; H03F 3/45179; H03F 3/005
USPC .................................. 341/155, 161, 172, 159
See application file for complete search history.

(56) References Cited

U.S. PATENT DOCUMENTS

| | | | |
|---|---|---|---|
| 6,166,595 A | 12/2000 | Moldsvar et al. | |
| 6,452,531 B1 | 9/2002 | Miller et al. | |
| 6,642,775 B2 * | 11/2003 | Imamiya | ....................... 327/536 |

(Continued)

FOREIGN PATENT DOCUMENTS

CN 101521496 3/2011

OTHER PUBLICATIONS

Notification of Transmittal of the International Search Report and the Written Opinion of the International Search Authority, or the Declaration for PCT/US2013/064999, filed Mar. 13, 2014, 15 pages.

*Primary Examiner* — Jean B Jeanglaude
(74) *Attorney, Agent, or Firm* — Cooley LLP

(57) ABSTRACT

Switched capacitor circuits and charge transfer methods include a sampling phase and a transfer phase. Circuits and methods are implemented via a plurality of switches, a set of at least two capacitors, at least one buffer amplifier, and an operational amplifier. In one example, during the sampling phase at least one input voltage is sampled, and during the transfer phase at least a first reference voltage provided by the at least one buffer amplifier is subtracted from the at least one input voltage using the operational amplifier. The same set of at least two capacitors may be used in both the sampling phase and the transfer phase.

44 Claims, 13 Drawing Sheets

(56) References Cited

U.S. PATENT DOCUMENTS

| | | |
|---|---|---|
| 6,778,009 B1 * | 8/2004 | Lee ................... 330/9 |
| 6,784,824 B1 | 8/2004 | Quinn |
| 6,909,391 B2 | 6/2005 | Rossi |
| 6,927,718 B2 | 8/2005 | Koch |
| 6,967,611 B2 | 11/2005 | Atriss et al. |
| 7,095,356 B1 | 8/2006 | Pentakota et al. |
| 7,190,296 B2 | 3/2007 | Gupta |
| 7,319,425 B2 | 1/2008 | Fiorenza et al. |
| 2004/0210801 A1 | 10/2004 | Prasad et al. |
| 2006/0158231 A1 | 7/2006 | Soeraasen |
| 2007/0035434 A1 | 2/2007 | Tachibana et al. |
| 2011/0210763 A1 | 9/2011 | Kushner et al. |

* cited by examiner

SWITCHED CAPACITOR CIRCUITS HAVING LEVEL-SHIFTING BUFFER AMPLIFIERS, AND ASSOCIATED METHODS

CROSS-REFERENCE TO RELATED APPLICATION

This present application claims a priority benefit to PCT application no. PCT/US2013/064999, filed Oct. 15, 2013, entitled "Switched Capacitor Circuits Having Level-Shifting Buffer Amplifiers, and Associated Methods", which is hereby incorporated by reference in its entirety, including drawings.

PCT Application no. PCT/US2013/064999 in turn claims a priority benefit to U.S. provisional application Ser. No. 61/712,838, filed Oct. 12, 2012, entitled "Switched Capacitor Circuit with Virtual Ground Buffer," which provisional application is hereby incorporated by reference in its entirety.

BACKGROUND

Switched capacitor circuits are widely used in analog signal processing circuits (e.g., discrete time sampled signal processing circuits) such as amplifiers, switched capacitor filters, pipeline and algorithmic analog-to-digital converters (ADCs), and delta sigma ADCs. In such circuits, charge is moved into and out of capacitors when switches are opened and closed (typically in a non-overlapping manner). In various implementations, switches generally are operated to sample an analog voltage of interest during a "sampling phase" (e.g., during which the analog voltage of interest is applied across one or more input capacitors); subsequently, during a "transfer phase," the switches are operated to transfer a charge representing the sampled analog voltage to another portion of circuitry for some type of processing of the sampled voltage. In some conventional implementations, an operational amplifier (op amp) is employed as part of the circuitry operable during the transfer phase; the operational amplifier processes the sampled analog voltage and provides a robust ratiometric output voltage as well as load driving capability.

SUMMARY

Applicants have recognized and appreciated that an operational amplifier employed in a circuit configuration with a switched capacitor architecture impacts performance of the overall circuit, due to performance limitations of the operational amplifier relating to speed, power consumption, accuracy, and noise. In view of the foregoing, various inventive embodiments disclosed herein generally relate to switched capacitor circuits having one or more buffer amplifiers and an operational amplifier, in which the buffer amplifier(s) mitigate at least some of the limitations imposed on the switched capacitor circuit by the operational amplifier.

In sum, one embodiment is directed to a switched capacitor circuit operable in a sampling phase and a transfer phase. The switched capacitor circuit comprises: a plurality of switches; at least one input capacitor; an integration capacitor; at least one buffer amplifier; and an operational amplifier. During the sampling phase, the plurality of switches are configured to couple a first input voltage to the at least one input capacitor and a second input voltage to the integration capacitor. During the transfer phase, the plurality of switches are configured to couple the at least one input capacitor, the integration capacitor, and the at least one buffer amplifier to the operational amplifier to subtract at least a first reference voltage from a sum voltage based on the first input voltage and the second input voltage so as to provide an output voltage from the operational amplifier, wherein an input of the at least one buffer amplifier is electrically coupled to an input terminal of the operational amplifier during the transfer phase.

Another embodiment is directed to a switched capacitor circuit operable in a sampling phase and a transfer phase. The switched capacitor circuit comprises: a plurality of switches; a set of at least two capacitors; at least one buffer amplifier; and an operational amplifier. During the sampling phase, at least one input voltage is sampled, and during the transfer phase at least a first reference voltage provided by the at least one buffer amplifier is subtracted from the at least one input voltage using the operational amplifier, wherein the same set of at least two capacitors is used in both the sampling phase and the transfer phase.

Another embodiment is directed to a charge transfer method, comprising: A) sampling at least one input voltage during a sampling phase; and B) subtracting, using an operational amplifier, at least a first reference voltage from the at least one input voltage during a transfer phase, the first reference voltage being provided by at least one buffer amplifier, wherein A) and B) are performed using a same set of at least two capacitors for both the sampling phase and the transfer phase.

Another embodiment is directed to a stage of a pipeline or algorithmic analog-to-digital converter. The stage comprises: a plurality of switches; at least one input capacitor; an integration capacitor; a first buffer amplifier to provide a first offset voltage on which a first reference voltage is based; a second buffer amplifier to provide a second offset voltage on which a second reference voltage is based; an M-bit flash analog-to-digital converter to control at least some of the plurality of switches during the transfer phase; and an operational amplifier. A number N of the at least one input capacitor is equal to $2^M-1$. During the sampling phase: 1) the plurality of switches are configured to couple a first input voltage to the at least one input capacitor and a second input voltage to the integration capacitor; and 2) the first input voltage is applied to an input of the M-bit flash ADC to provide an M-bit digital output code from the M-bit flash ADC based at least in part on the first input voltage. During the transfer phase: 1) the plurality of switches are configured to couple at least one of the at least one input capacitor, and to couple the integration capacitor and one of the first buffer amplifier and the second buffer amplifier, to the operational amplifier to subtract a fraction of a corresponding one of the first reference voltage and the second reference voltage from a sum voltage based on the first input voltage and the second input voltage so as to provide an output voltage from the operational amplifier, wherein the fraction is based at least in part on a digital value of the M-bit digital output code; and 2) the M-bit digital output code from the M-bit flash ADC controls at least some of the plurality of switches to select the one of the first buffer amplifier and the second buffer amplifier.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

DETAILED DESCRIPTION

Following below are more detailed descriptions of various concepts related to, and embodiments of, inventive apparatus and methods relating to switched capacitor circuits. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

Figure 1:
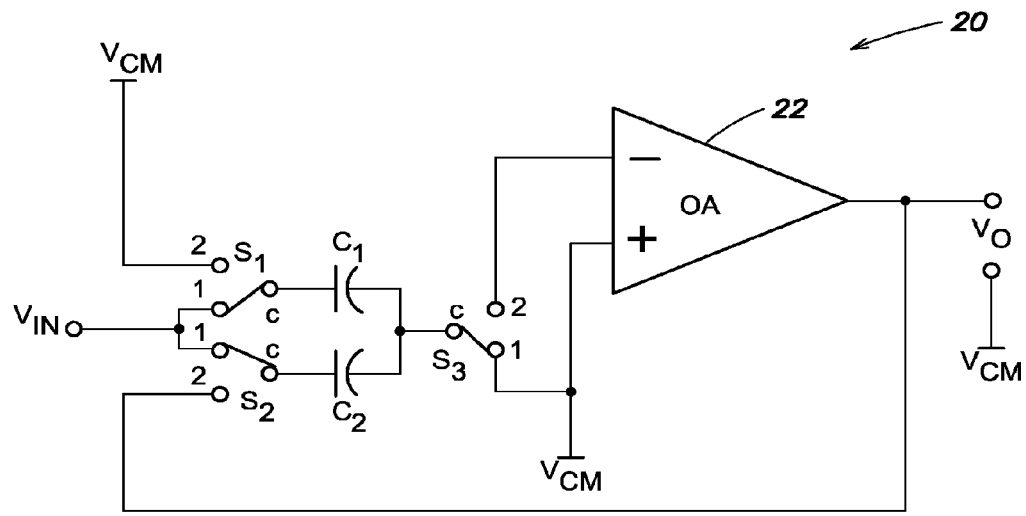
FIG. 1 provides an illustration of a switched capacitor circuit that includes an operational amplifier.

FIG. 1 provides an illustration of a switched capacitor circuit 20 that includes an operational amplifier 22. The circuit 20 also includes two capacitors $C_1$ and $C_2$, and three switches $S_1$, $S_2$ and $S_3$. An analog input voltage $V_{IN}$ to be sampled (hereafter referred to as "input voltage") provides an input to the circuit 20, and a voltage $V_O$ (hereafter referred to as "output voltage") is provided as an output of the circuit 20. FIG. 1 also illustrates a system common-mode voltage $V_{CM}$ (e.g., ground) serving as a reference potential for the input voltage $V_{IN}$ and the output voltage $V_O$.

As would be readily appreciated by one of skill in the art, in the circuit of FIG. 1 the switches $S_1$, $S_2$ and $S_3$ are operable to operate the circuit in two phases, namely a "sampling phase" and a "transfer phase." For purposes of illustration, in FIG. 1 each of the switches is shown as a single-pole double-throw (SPDT) switch having a common terminal C and respective output terminals 1 and 2.

Figure 1A:
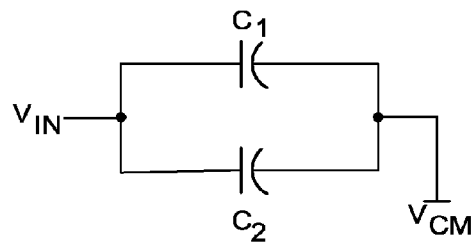
FIG. 1A illustrates the circuit of FIG. 1 redrawn without switches and showing the state of electrical connections during a sampling phase of circuit operation.
Figure 1B:
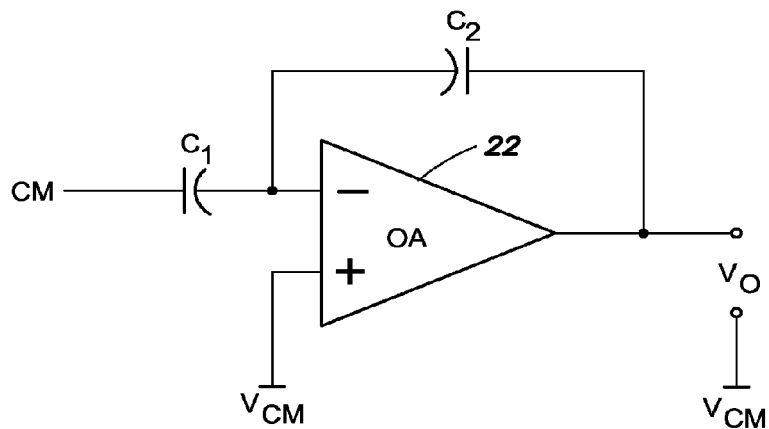
FIG. 1B illustrative the circuit of FIG. 1 redrawn without switches and showing the state of electrical connections during a transfer phase of circuit operation.

During the sampling phase, the switches are operated to be in the state shown in FIG. 1, i.e., the common terminal C of each switch is electrically coupled to terminal 1 of the switch. FIG. 1A illustrates the circuit of FIG. 1 redrawn without the switches $S_1$, $S_2$ and $S_3$ and showing the state of electrical connections during the sampling phase. As shown in FIG. 1A, the input voltage $V_{IN}$ is applied similarly across both capacitors $C_1$ and $C_2$ arranged in a parallel configuration. Thus, the total charge $Q_{total}$ stored during the sampling phase is given is $V_{IN}+C_2$). During the transfer phase, the switches are operated such that the common terminal C of each switch is electrically coupled to terminal 2 of the switch. FIG. 1B illustrative the circuit of FIG. 1 redrawn without the switches $S_1$, $S_2$ and $S_3$ and showing the state of electrical connections during the transfer phase. Given the configuration of the capacitors C1 and C2 in the transfer phase, the capacitor C1 is hereafter referred to as an "input capacitor," and the capacitor C2 is hereafter referred to as an "integration capacitor." In the transfer phase, because there is no potential different across C1, all of the charge is transferred to $C_2$, i.e., $Q_{total}=C2*V_O$.

Assuming the operational amplifier 22 is ideal, and presuming that charge is conserved between the sampling phase and the transfer phase, the output voltage accordingly is given by:

$$V_O=(n+1)V_{IN} \quad (1)$$

where $n=C_1/C_2$. Thus, the input voltage is amplified by a fixed gain n+1, which is determined only by the ratio of capacitors. It should be appreciated that n may have a variety of values based on respective capacitance values of the capacitors $C_1$ and $C_2$. For example, if the respective capacitance values are substantially equal, a gain of essentially two is achieved; similarly, for a capacitance value of $C_2$ that is significantly greater than $C_1$, a gain that approaches substantially unity gain may be provided.

In practice, the operational amplifier 22 is not ideal and has limitations that impact the performance of the circuit 20 in terms of the speed, power consumption, accuracy, and noise of the circuit. If the op amp has finite DC gain, the output voltage is shown to be:

$$V_O = \frac{(n+1)}{1+\frac{(n+1)}{a_o}} V_{IN} \quad (2)$$

where $a_o$ is the DC gain of the op amp. The resulting fractional error in the output voltage is then $(n+1)/a_o$. For example, with $a_o=1,000$, and a closed-loop gain of n+1=10, the error is approximately 1%, which is significant and potentially excessive for some practical applications of the circuit 20. In this context, it should be noted that the higher the closed-loop gain n+1, the larger the error. Furthermore, increasing the DC gain $a_o$ of the op amp requires complex circuitry and results in increased power consumption and increased noise of the resulting circuit.

The maximum operating frequency of the circuit 20 also is limited by the op amp bandwidth. It can be shown that the closed loop –3 dB bandwidth of the circuit 20 in the transfer state shown in FIG. 1B is:

$$\omega_h = \frac{\omega_1}{n+1}, \quad (3)$$

where $\omega_1$ is the gain-bandwidth product (unity-gain frequency) of the op amp. The higher the closed loop gain n+1, the lower the closed loop bandwidth. To achieve relatively high bandwidth (and thus high operational speed), the gain-bandwidth product of the op amp must be made high, which requires high power consumption.

In the circuit of FIG. 1, noise generated by the operational amplifier 22 is typically the dominant source of noise in the circuit 20, because the op amp is a complex circuit with many devices contributing noise. It can be shown that the noise $v_n$ in the circuit shown in FIG. 1B, referred to the input voltage $V_{IN}$ is the same as the op amp noise $v_{eq1}$ referred to its own input:

$$v_n=v_{eq1} \quad (4)$$

Since the noise of the op amp $v_{eq1}$ generally is relatively large, the corresponding circuit noise $v_n$ is also large. Reducing the op amp noise requires a considerable amount of power.

In view of the foregoing, various inventive embodiments disclosed herein generally relate to switched capacitor circuits having one or more buffer amplifiers and an operational amplifier, in which the buffer amplifier(s) mitigate at least some of the limitations imposed on the switched capacitor circuit by the operational amplifier.

Figure 2:
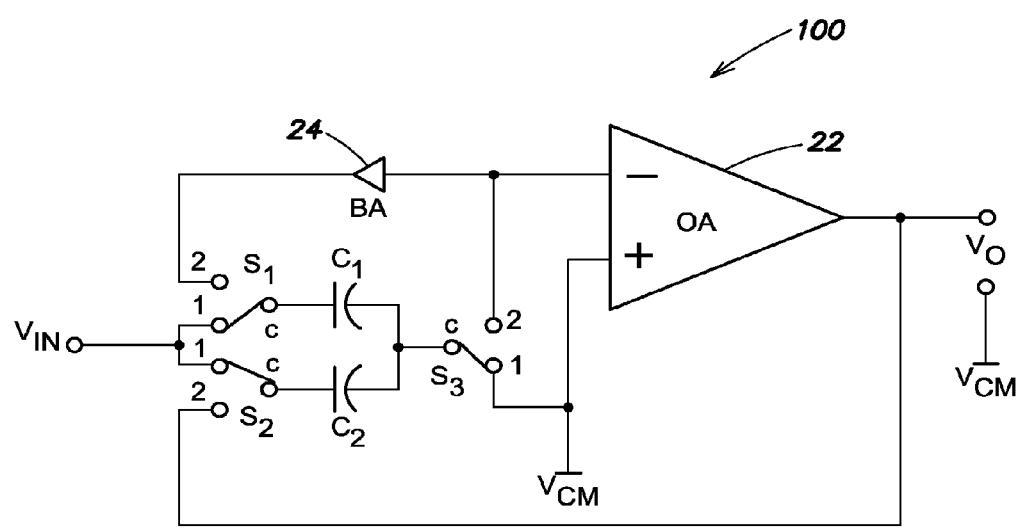
FIG. 2 illustrates an example of a switched capacitor circuit including a buffer amplifier, according to one embodiment of the present invention.

FIG. 2 illustrates an example of a switched capacitor circuit 100 including a buffer amplifier (BA) 24, according to one embodiment of the present invention. The circuit is operated similarly to that shown in FIG. 1, namely, in which the switches $S_1$, $S_2$ and $S_3$ are operated so as to configure the circuit 100 in a sampling phase and in a transfer phase, respectively. During the sampling phase of FIG. 2, the circuit 100 is electronically configured as shown in FIG. 1A, i.e., the input voltage $V_{IN}$ is applied similarly across both capacitors $C_1$ and $C_2$ arranged in a parallel configuration. However, unlike the circuit 20 shown in FIG. 1, during the transfer phase in the circuit of FIG. 2 the switches are operated so as to place the circuit 100 in the configuration shown in FIG. 2A, in which the buffer amplifier 24 is coupled to the capacitors $C_1$ and $C_2$. More specifically, in FIG. 2A the capacitor C1 is driven by the output of the buffer amplifier 24, wherein an input of the buffer amplifier 24 is electrically coupled to an input terminal of the operational amplifier (at the inverting input of the operational amplifier 22), rather than having the capacitor $C_1$ coupled to $V_{CM}$ as shown in FIG. 1B. Presuming the buffer amplifier 24 has a voltage gain of one, the output voltage $V_O$ of the circuit 100 is given as:

$$V_O = \frac{(n+1)}{1+\frac{1}{a_o}} V_{IN} \quad (5)$$

By comparing Equation (5) above to Equation (2), it may be observed that due to the addition to the circuit of the buffer amplifier 24, the fractional error in the output voltage $V_O$ is thus $1/a_o$, which is a factor of (n+1) smaller than in the circuit of FIG. 1. In practice, the gain of the buffer amplifier 24 may deviate slightly from unity and have a small gain error $\epsilon$. If such an error is taken into consideration and the voltage gain of the buffer amplifier 24 is taken as 1–$\epsilon$, the output voltage $V_O$ is then given by:

$$V_O = \frac{(n+1)}{1+\frac{1+n\varepsilon}{a_o}} V_{IN} \quad (6)$$

Since a typical buffer amplifier has a gain close to unity, $\epsilon \ll 1$ and the fractional error in the output voltage $V_O$ as shown in Equation (6) above nonetheless is still significantly smaller than in the circuit of FIG. 1. In particular, by comparing Equation (2) and Equation (6) it is clear that the circuit 100 in FIG. 2 reduces the gain error by a factor of:

$$\frac{1+n}{1+n\varepsilon}. \quad (7)$$

For the circuit 100 of FIG. 2, it can be shown that the bandwidth of the circuit is given by:

$$\omega_h = \frac{\omega_1}{1 + n\varepsilon} \quad (8)$$

Compared with the bandwidth given in Equation (3) for the circuit in FIG. 1, the bandwidth is improved by the same factor by which the gain is reduced, namely:

$$\frac{1+n}{1+n\varepsilon}.$$

Since generally e<<1 in a buffer amplifier, the bandwidth is effectively improved by approximately a factor of 1+n.

Figure 2A:
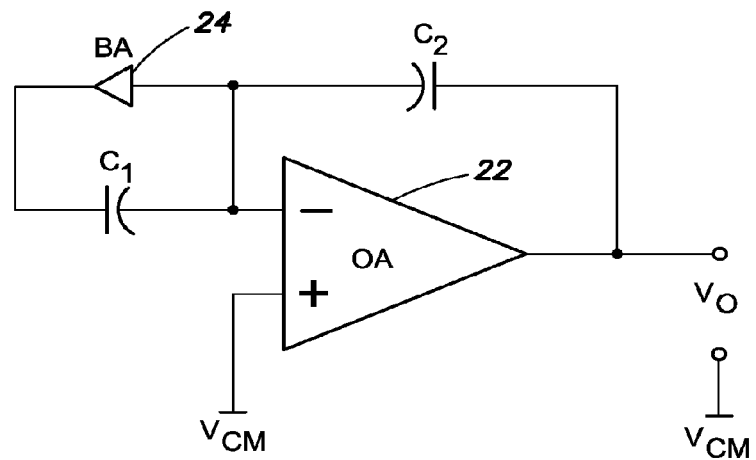
FIG. 2A illustrative the circuit of FIG. 2 redrawn without switches and showing the state of electrical connections during a transfer phase of circuit operation.

In the circuit 100 of FIG. 2, the noise property is also significantly improved compared with the circuit 20 shown in FIG. 1. In particular, it can be shown that the input referred noise of the circuit during the transfer phase shown in FIG. 2A is $$v_n = v_{eq1} \frac{1 + n\varepsilon}{1 + n} \quad (9)$$

Compared with the input referred noise given in Equation (4) for the circuit in FIG. 1, the noise is improved by the same factor by which the gain is reduced, namely:

$$\frac{1+n}{1+n\varepsilon}.$$

In sum, the circuit 100 of FIG. 2 improves three key performance parameters, namely, the gain accuracy, the bandwidth, and noise by the same factor, i.e., (1+n)/(1+nε). Therefore, it is advantageous for the buffer amplifier to provide voltage gain as close to unity as possible such that nε<<1 for significant improvements on these key parameters.

The buffer amplifier 24 of the circuit 100 shown in FIG. 2 (and FIG. 2A) may be implemented in a variety of manners according to different embodiments. In one implementation, the buffer amplifier 24 may be implemented using an operational amplifier (different from the op amp 22) in a unity-gain buffer configuration. Another implementation of the buffer amplifier 24 is shown in FIG. 3, in which the buffer amplifier 24 is implemented as a source follower comprising a MOS transistor $M_1$ and a current source $I_1$.

Figure 3:
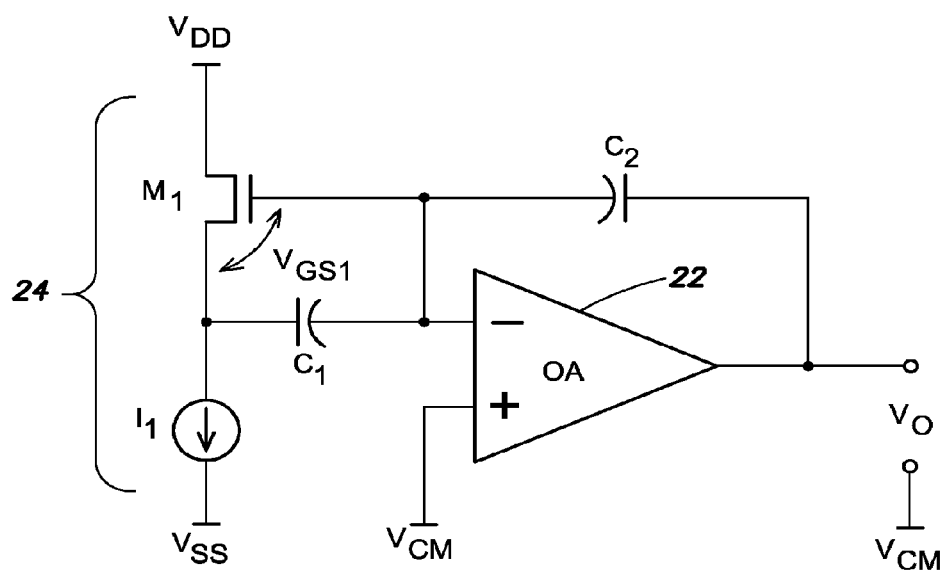
FIG. 3 illustrates the circuit of FIG. 2A, in which the buffer amplifier is implemented as a source follower comprising a MOS transistor and a current source, according to another embodiment of the present invention.
Figure 4:
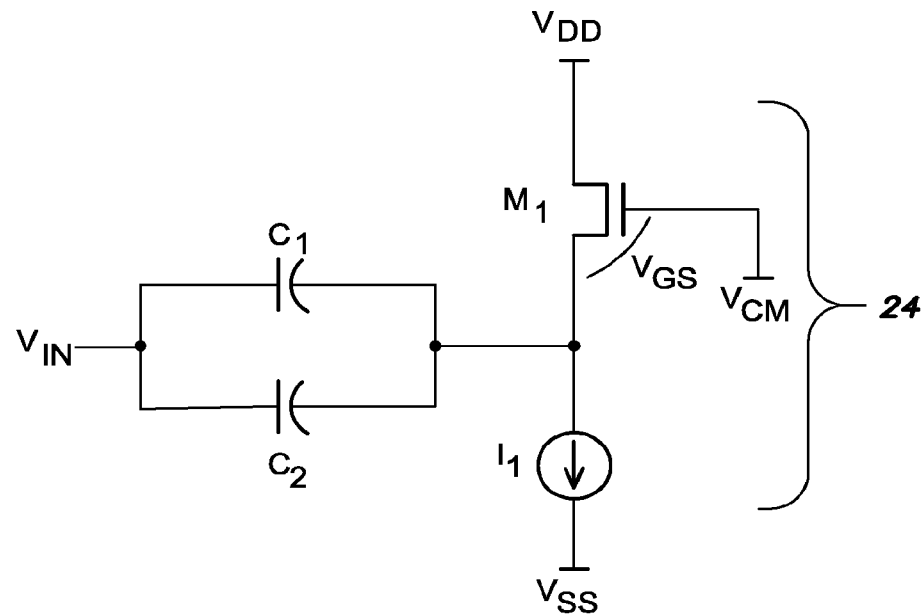
FIG. 4 illustrates the sampling phase of a switched capacitor circuit according to another embodiment, in which a buffer amplifier implemented as a source follower is included in the respective circuit configurations of both the sampling phase and the transfer phase.

The source follower buffer amplifier shown in FIG. 3 may in some cases have an appreciable offset between its input and the output voltages (an "offset voltage" of the buffer amplifier) given by the gate-to-source voltage $V_{GS1}$ of $M_1$. As discussed further below, in some embodiments a buffer amplifier's offset voltage may be advantageously employed in some analog-to-digital converter (ADC) configurations to intentionally provide a reference voltage that is subtracted from the input voltage $V_{IN}$ so as to provide an output voltage $V_O$ from a switched capacitor circuit for further processing in the ADC. However, in other implementations involving switched capacitor circuits, this offset of the buffer amplifier (e.g., arising from the gate-to-source voltage $V_{GS1}$ of $M_1$) may in turn give rise to an undesirable error in the output voltage $V_O$ of the circuit 100 as provided during the transfer phase. Accordingly, in another embodiment, a potential output voltage error arising from a buffer amplifier offset may be significantly mitigated if appropriate by modifying the circuit configuration such that, during the sampling phase, the buffer amplifier is also included in the circuit during the sampling of the input voltage $V_{IN}$. FIG. 4 illustrates the electrical connections during a sampling phase of a specific implementation of this embodiment using the source follower comprising the MOS transistor $M_1$ and the current source $I_1$ as the buffer amplifier 24. In FIG. 4, during the sampling phase the parallel-configured capacitors are coupled between the input voltage $V_{IN}$ and an output of the buffer amplifier 24. The input of the buffer amplifier 24 in turn is coupled to the common-mode voltage $V_{CM}$. Thus, the voltage sampled by the capacitors C1 and C2 is $V_{IN}$-$V_{GS}$, and the portion of the charge stored during the sampling phase that is attributable to $V_{GS}$ is effectively canceled out during the transfer phase (as shown in FIG. 3).

In yet other inventive embodiments disclosed herein, a buffer amplifier's offset voltage may be advantageously employed.

For example, in switched-capacitor ADCs such as pipeline, algorithmic, and delta-sigma ADCs, the input voltage $V_{IN}$ is sampled, a quantized input voltage is subtracted from the sampled input voltage, and then the result is amplified by a fixed gain (e.g. via an operational amplifier). The amplified result (e.g., output of an operational amplifier) typically is referred to as a "residue voltage," which is then passed to another stage of the ADC for further processing and/or for added resolution.

Figure 5:
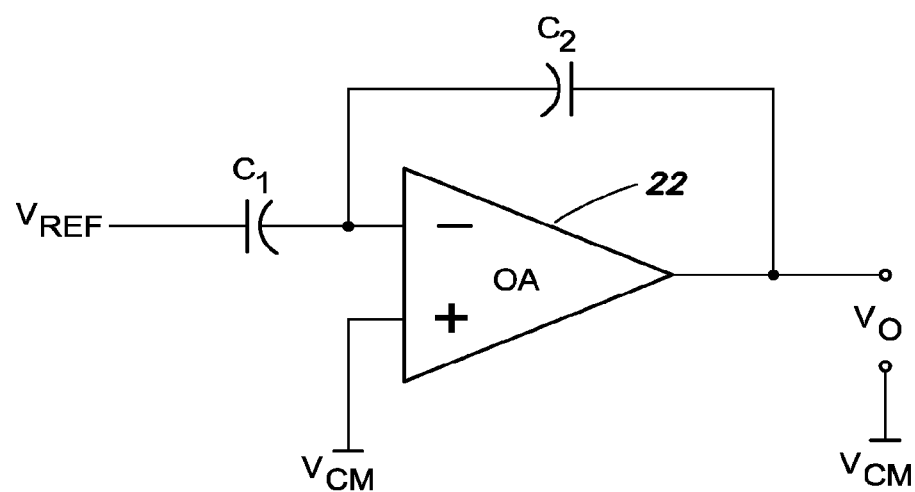
FIG. 5 illustrates the transfer phase of a circuit similar to that shown in FIG. 1B, in which a capacitor is coupled to a reference voltage instead of a common-mode voltage.
Figure 4A:
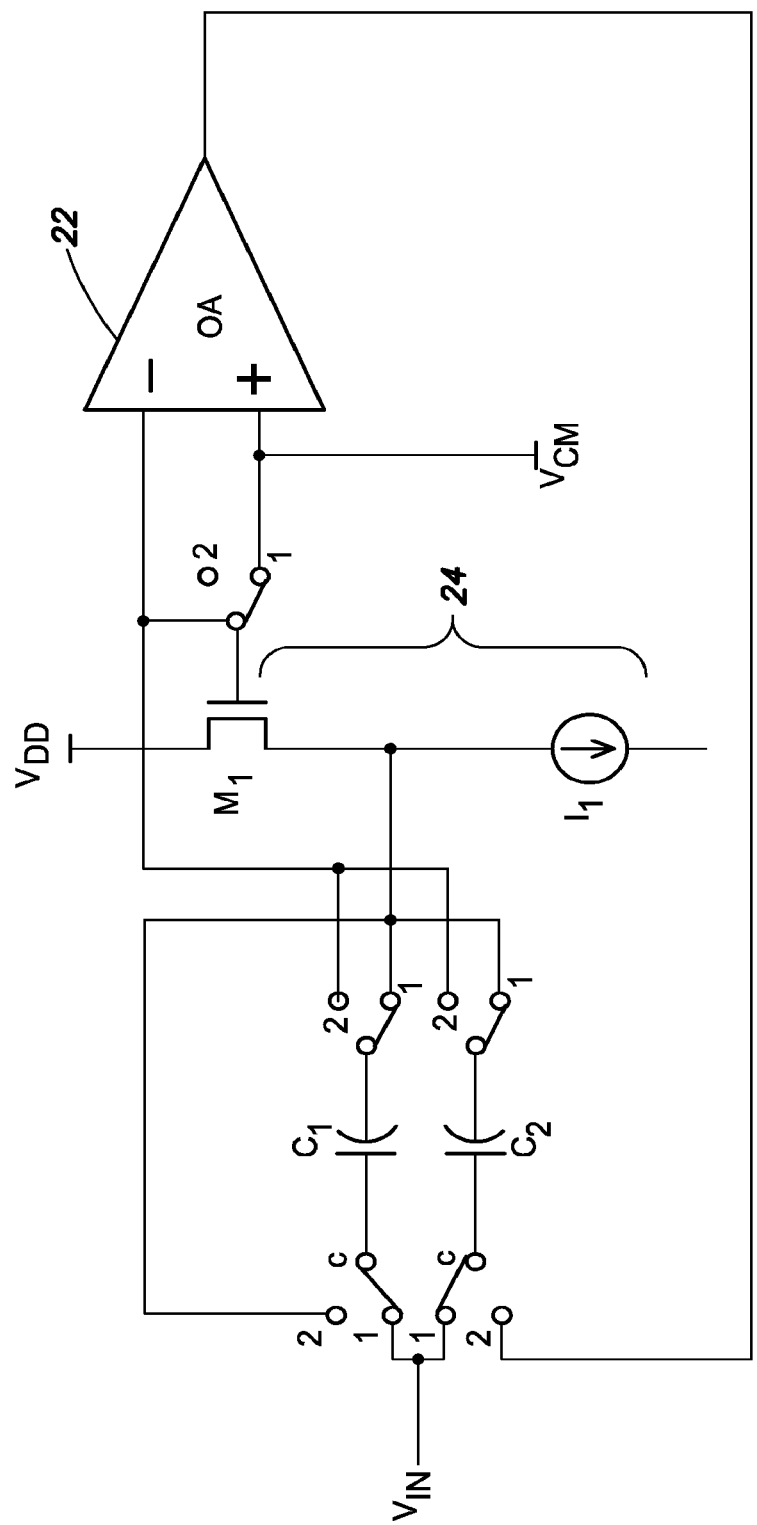
FIG. 4A illustrates an example of a switched capacitor circuit including a buffer amplifier, according to one embodiment of the present invention, that facilitates configuration of the sampling phase shown in FIG. 4 and the transfer phase shown in FIG. 3.

In some implementations of switched-capacitor ADCs, the quantized input voltage that is subtracted from the sampled input voltage is based at least in part on a reference voltage (i.e., some multiplier of a reference voltage represents the quantized input voltage, which is in turn subtracted from the sampled input voltage). Referring again for the moment to FIG. 1B which illustrates the transfer phase of the circuit of FIG. 1, to accomplish such a subtraction of a reference voltage from the sampled input voltage, the capacitor $C_1$ may be coupled during the transfer phase to a reference voltage $V_{REF}$ (rather than coupling the capacitor $C_1$ to the common mode voltage $V_{CM}$ as shown in FIG. 1B). This situation is illustrated in FIG. 5. The output voltage $V_O$ in FIG. 5 is then given by:

$$V_O = (n+1)V_{IN} - nV_{REF}, \quad (10)$$

where, depending on the polarity of the reference voltage $V_{REF}$, a multiple n of the absolute value of the reference voltage $V_{REF}$ may be added to or subtracted from a multiple (n+1) of the input voltage $V_{IN}$.

According to one inventive embodiment relating to the foregoing concept, the reference voltage $V_{REF}$ may be provided in the context of the benefits afforded by the portions of circuits shown in FIG. 2A and FIG. 3 (i.e., transfer phase configurations that include one or more buffer amplifiers) by using an appreciable offset voltage of a buffer amplifier as the reference voltage $V_{REF}$. Such a buffer amplifier with an intentional and significant offset voltage is referred to herein as a "level-shifting buffer amplifier." With reference again to FIG. 3 in which the buffer amplifier 24 is implemented as a source follower, the $V_{GS}$ offset voltage of the source follower may be utilized to provide the addition or subtraction of a reference voltage to or from a multiple of the input voltage $V_{IN}$, presuming that the buffer amplifier is not included in the circuit configuration of the sampling phase (i.e., the configuration shown in FIG. 4 is not employed in this embodiment). More specifically, in this embodiment, during the sampling phase the input voltage $V_{IN}$ is sampled on capacitors $C_1$ and $C_2$ with reference to the system common-mode voltage $V_{CM}$ (see FIG. 1A). During the transfer phase, the capacitor $C_1$ is driven by the buffer amplifier 24 as shown in FIG. 3. This effectively changes the voltage on $C_1$ from $V_{IN}$ during the sampling phase to $V_{CM}-V_{GS1}$ during the transfer phase, where $V_{GS1}$ is the gate-to-source voltage of $M_1$ and essentially provides the reference voltage $V_{REF}$.

Figure 6:
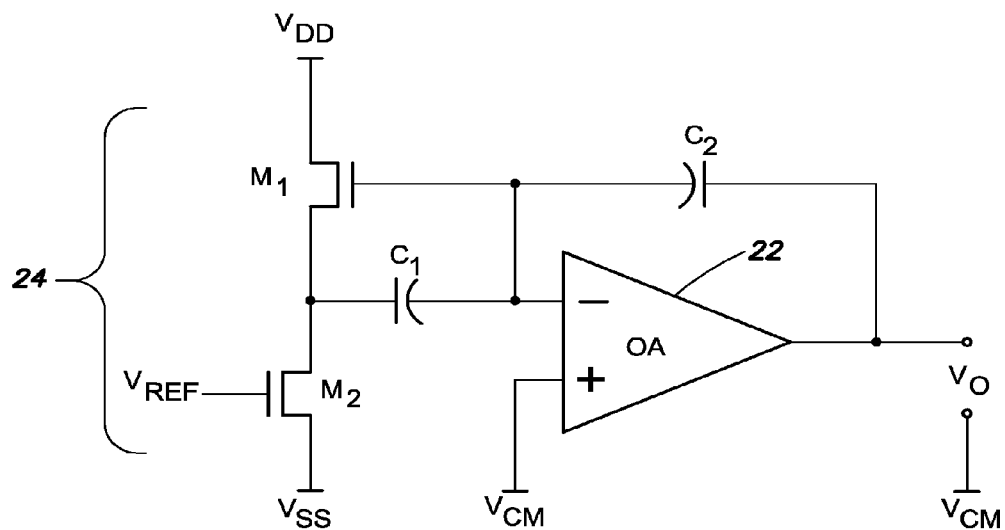
FIG. 6 illustrates the transfer phase of a circuit according to another embodiment of the invention, in which a buffer amplifier is implemented as a matched pair of transistors to provide an offset voltage serving as a reference voltage to be added to or subtracted from a multiple of the input voltage sampled during the sampling phase.

One practical issue regarding the suitability of $V_{GS1}$ as a reference voltage $V_{REF}$ relates to the dependence of $V_{GS1}$ on one or more of process parameters, temperature, and power supply voltages. In view of the foregoing, in yet another embodiment, a level-shifting buffer amplifier 24 having an offset voltage serving as a reference voltage $V_{REF}$ is provided by a matched pair of transistors $M_1$ and $M_2$, as shown in FIG. 6. By employing a matched pair of transistors for $M_1$ and $M_2$ and by tying the well of M1 to its source, the gate-to-source voltages of $M_1$ and $M_2$ are matched:

$$V_{GS1}=V_{GS2}=V_{REF}$$

Accordingly, a more stable offset voltage may be provided by the buffer amplifier 24 in FIG. 6, resulting in a more stable and accurate reference voltage $V_{REF}$ that may be subtracted from a multiple of the input voltage $V_{IN}$ according to Equation (10) above.

The subtraction of $V_{REF}$ from a sampled input voltage can be accomplished with a buffer amplifier having a positive offset voltage, such as a PMOS source follower, or by employing a fully-differential topology. Also, in some implementations the voltage $V_{REF}$ may be adjusted such that a desired absolute value for $V_{REF}$ may be added or subtracted (e.g., if $V_{GS1}$ is not equal to $V_{GS2}$ due, for example, to the body effect or intentional transistor mismatch).

In some implementations of switched-capacitor ADCs, the quantized input voltage that is subtracted from a sampled input voltage is generated in part by the operation of a low resolution "flash ADC." As known in the art, a flash ADC employs a linear voltage ladder having a comparator at each rung of the ladder to compare the sampled input voltage to successive reference voltages. The resolution of the flash ADC (i.e., number of bits in the digital output code) may range from one to five bits, for example, in which the number of comparators required for the flash ADC relates to the number of bits (e.g., a 1-bit flash ADC includes a single comparator, while a 5-bit flash ADC includes 31 comparators). The subtraction of the quantized input voltage is performed by connecting one or more input capacitors to one or more reference voltages during the transfer phase of operation, wherein the number of input capacitors is based on the resolution (number of bits in the output code) of the flash ADC.

Figure 7:
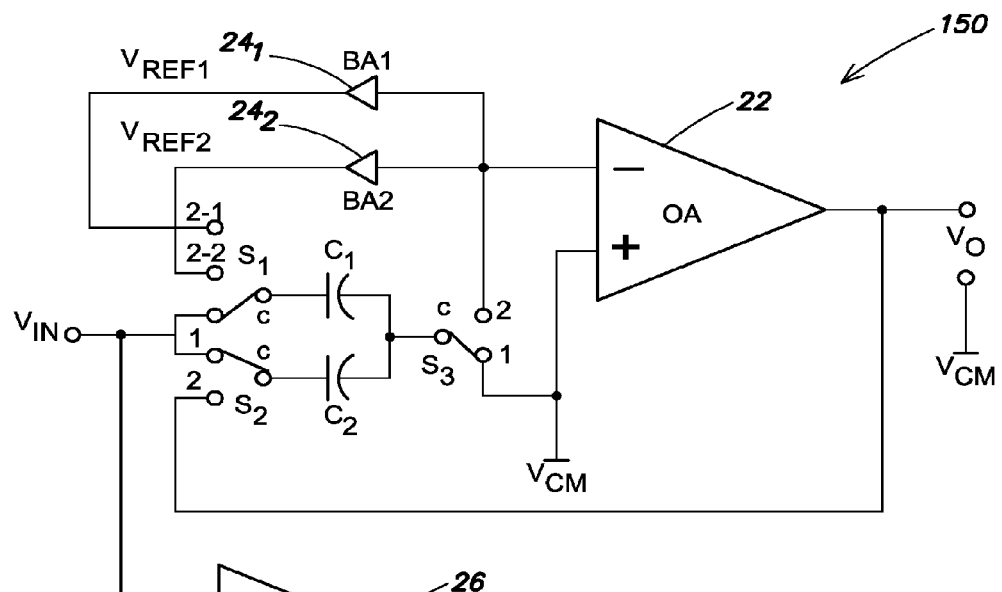
FIG. 7 illustrates an example of a switched capacitor circuit constituting a 1-bit per stage pipeline ADC stage with a 1-bit flash ADC, and two buffer amplifiers to provide corresponding reference voltages respectively representing quantized input voltages, according to another embodiment.
Figure 7A:
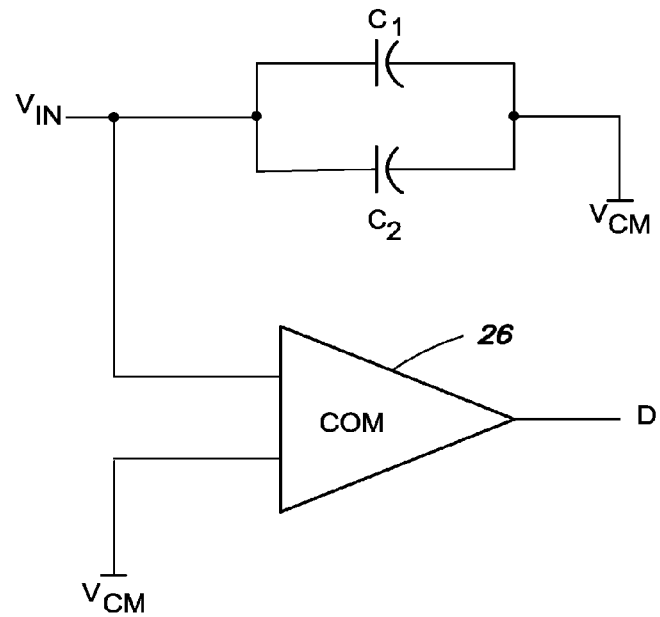
FIG. 7A illustrates the circuit of FIG. 7 redrawn without switches and showing the state of electrical connections during a sampling phase of circuit operation.

FIG. 7 illustrates an example, according to one embodiment, of a switched capacitor circuit 150 constituting a 1-bit per stage pipeline ADC stage with a 1-bit flash ADC comprising a single comparator 26. The circuit 150 of FIG. 7 also comprises two level-shifting buffer amplifiers $24_1$ and $24_2$ to provide corresponding reference voltages $V_{REF1}$ and $V_{REF2}$ respectively representing quantized input voltages. As in the circuits of FIG. 1 and FIG. 2, the switches $S_1$, $S_2$ and $S_3$ are operated so as to configure the circuit 150 in a sampling phase and in a transfer phase, respectively. During the sampling phase of FIG. 7, the circuit 150 is electronically configured as shown in FIG. 7A, i.e., the input voltage $V_{IN}$ is applied similarly across both capacitors $C_1$ and $C_2$ arranged in a parallel configuration, and to the comparator 26 of the 1-bit flash ADC. During the transfer phase in the circuit of FIG. 7, the switches are operated so as to place the circuit 150 in the configuration shown in FIG. 7B, in which the switch S1 couples one of the buffer amplifiers $24_1$ and $24_2$ to the input capacitor $C_1$ based on the state of the 1-bit output D of the comparator 26.

More specifically, in the sampling phase shown in FIG. 7A, the comparator 26 of the flash ADC compares the input voltage $V_{IN}$ with $V_{CM}$ and provides as an output a 1-bit digital output code D according to:

$$D=1 \text{ if } V_{IN}>V_{CM}$$

$$D=-1 \text{ if } V_{IN}<V_{CM} \quad (12)$$

Figure 7B:
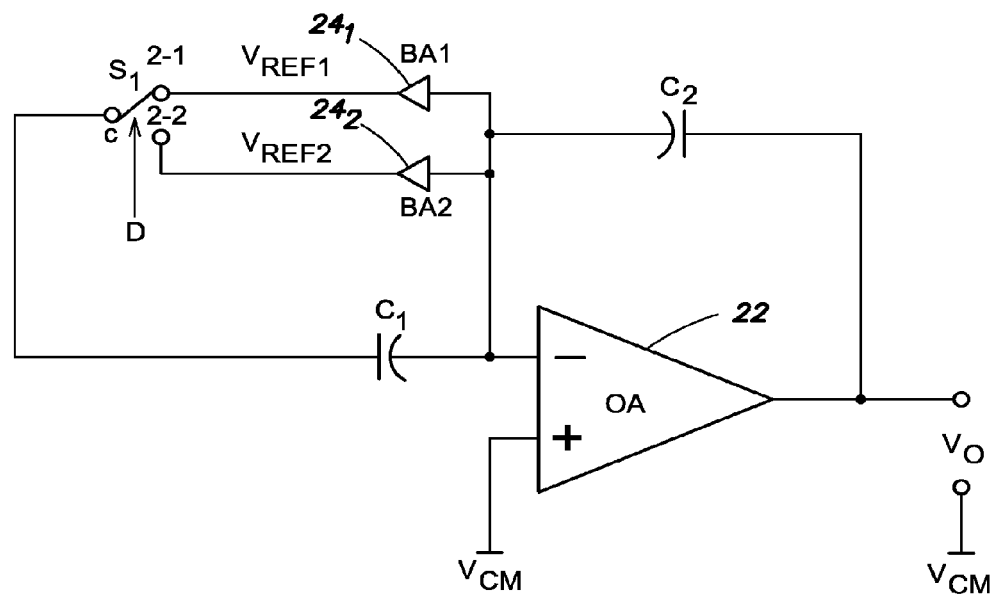
FIG. 7B illustrative the circuit of FIG. 7 redrawn without switches and showing the state of electrical connections during a transfer phase of circuit operation.

During the transfer phase shown in FIG. 7B, one of the states of the 1-bit digital output code D operates the switch $S_1$ so as couple the input capacitor $C_1$ to the reference voltage $V_{REF1}$ provided by the buffer amplifier $24_1$ (BA1), and the other of the states of D operates the switch so as couple the input capacitor $C_1$ to the reference voltage $V_{REF2}$ provided by the buffer amplifier $24_2$ (BA2).

In one exemplary implementation, the absolute value of the two reference voltages $V_{REF1}$ and $V_{REF2}$ (provided by the offset voltages of the buffer amplifiers BA1 and BA2, respectively) may be the same, and the respective reference voltages may have opposite polarities. In this example, accordingly the absolute value of the reference voltage is added as a quantized input voltage to the sampled input voltage during the transfer phase for one state of D, and for the other state of D the absolute value of the reference voltage is subtracted as a quantized input voltage from the sampled input voltage during the transfer phase. However, it should be appreciated that in other embodiments the respective absolute values for the reference voltages $V_{REF1}$ and $V_{REF2}$ may be different, and/or the respective polarities of the reference voltages $V_{REF1}$ and $V_{REF2}$ may be the same; thus a variety of respective reference voltages are contemplated in different inventive embodiments. As discussed above, in various embodiments, each reference voltage may be realized via a particular implementation of a level-shifting buffer amplifier giving rise to a particular offset voltage for the buffer amplifier. A given reference voltage that is ultimately selected via the 1-bit output signal D of the flash ADC and the switch $S_1$ is applied as a quantized input voltage to the sampled input voltage $V_{INT}$ to provide an output voltage $V_O$ according to Equation (10) above, which may serve as a residue voltage (e.g., in a given stage of a pipeline ADC).

It is particularly noteworthy in the circuit 150 of FIG. 7 that the same set of capacitors $C_1$ and $C_2$ is used to both sample the input voltage $V_{IN}$ during the sampling phase, and to facilitate generation of the output voltage $V_O$ during the transfer phase. Using the same set of capacitors in this manner significantly reduces noise and provides for a spatially economic and efficient fabrication footprint for the circuit 150.

Figure 8:
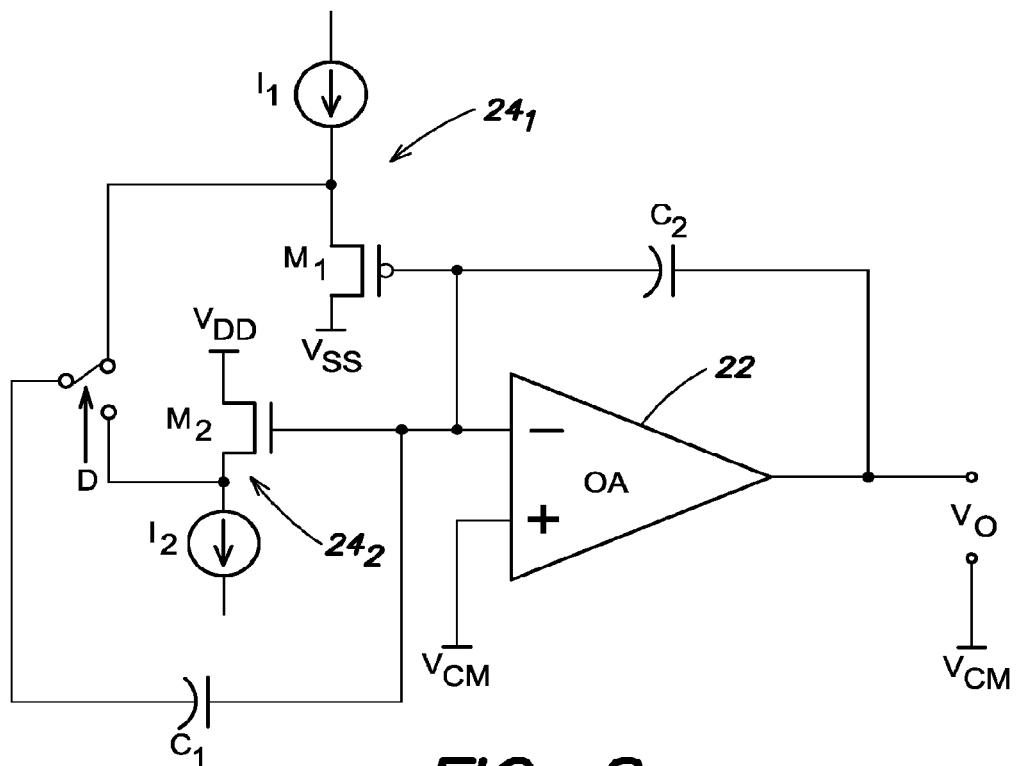
FIG. 8 illustrates the circuit of FIG. 7B, in which the buffer amplifiers are implemented as source followers each comprising a MOS transistor and a current source, according to another embodiment of the present invention.

As discussed above in connection with FIG. 3 and FIG. 6, various implementations of level-shifting buffers $24_1$ and $24_2$ are contemplated according to various inventive embodiments disclosed herein. One implementation based on the source follower buffer amplifier shown in FIG. 3, in the context of the transfer phase of the circuit 150 shown in FIG. 7B, is illustrated in FIG. 8. In particular, a positive level-shifting buffer amplifier $24_1$ is implemented as a PMOS source follower comprising a PMOS transistor $M_1$ and a current source $I_1$. The positive level shift is provided by the gate-to-source voltage of the transistor $M_1$. A negative level-shifting buffer amplifier $24_2$ is implemented as a NMOS source follower comprising an NMOS transistor $M_2$ and a current source $I_2$. The negative level shift is provided by the gate-to-source voltage of the transistor $M_2$. As noted above, it should be appreciated that the respective gate-to-source voltages can be adjusted to produce a desired effective reference voltage.

Figure 9:
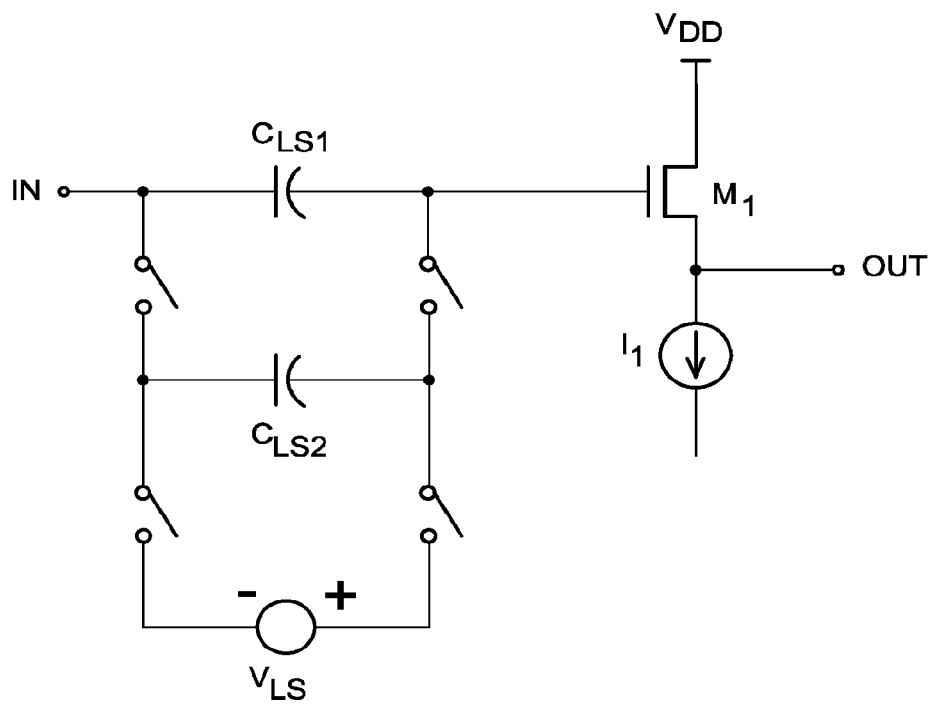
FIG. 9 illustrates a level-shifting buffer amplifier implementation involving level shifting capacitors and a source follower configuration, according to another embodiment of the present invention.

FIG. 9 illustrates a level-shifting buffer amplifier implementation according to yet another embodiment, based on level shifting capacitors $C_{LS1}$ and $C_{LS2}$. During the sampling phase, the depicted switches are operated such that an additional level shift voltage $V_{LS}$ is sampled across $C_{LS2}$. During the transfer phase, the switches are operated such that the capacitors $C_{LS1}$ and $C_{LS2}$ are connected in parallel. After a few clock cycles, the voltage across $C_{LS1}$ and $C_{LS2}$ converges to $V_{LS}$. The total amount of level shift provided by the level-shifting buffer is $V_{LS}-V_{GS1}$. This embodiment provides an additional degree of freedom so that $V_{GS1}$ can be chosen independently of the total amount of level shift. A similarly implemented PMOS source follower with an additional level shifting capacitor provides positive level shifting.

With respect to source follower implementations of a level-shifting buffer amplifier according to various embodiments of the present invention, the voltage gain of a MOS follower is given by:

$$a = \frac{1}{1 + \frac{g_{mb}}{g_m} + \frac{1}{g_m(r_o \| R_o)}} \approx \frac{1}{1 + \frac{g_{mb}}{g_m}} \quad (13)$$

where $g_{mb}$, $r_o$, and $R_o$ are the back-gate transconductance of the MOS transistor, the output resistance of the MOS transistor, the output resistance of the current source, respectively. Typically $$g_m(r_o \| R_o) \gg 1, \quad (14)$$

and thus $$a \approx \frac{1}{1 + \frac{g_{mb}}{g_m}}. \quad (15)$$

Since the ratio $g_{mb}/g_m$ is on the order of 0.1-0.2 in modern MOS transistors, the gain of a source follower is generally lower than unity (e.g., on the order of 0.8 to 0.9), which essentially corresponds to a value for the gain error $\epsilon$ of a buffer amplifier of 0.2 to 0.1. From Equations (6) through (9) above, it may be readily appreciated that, in some implementations, it is desirable to significantly reduce the value of $\epsilon$.

Figure 10:
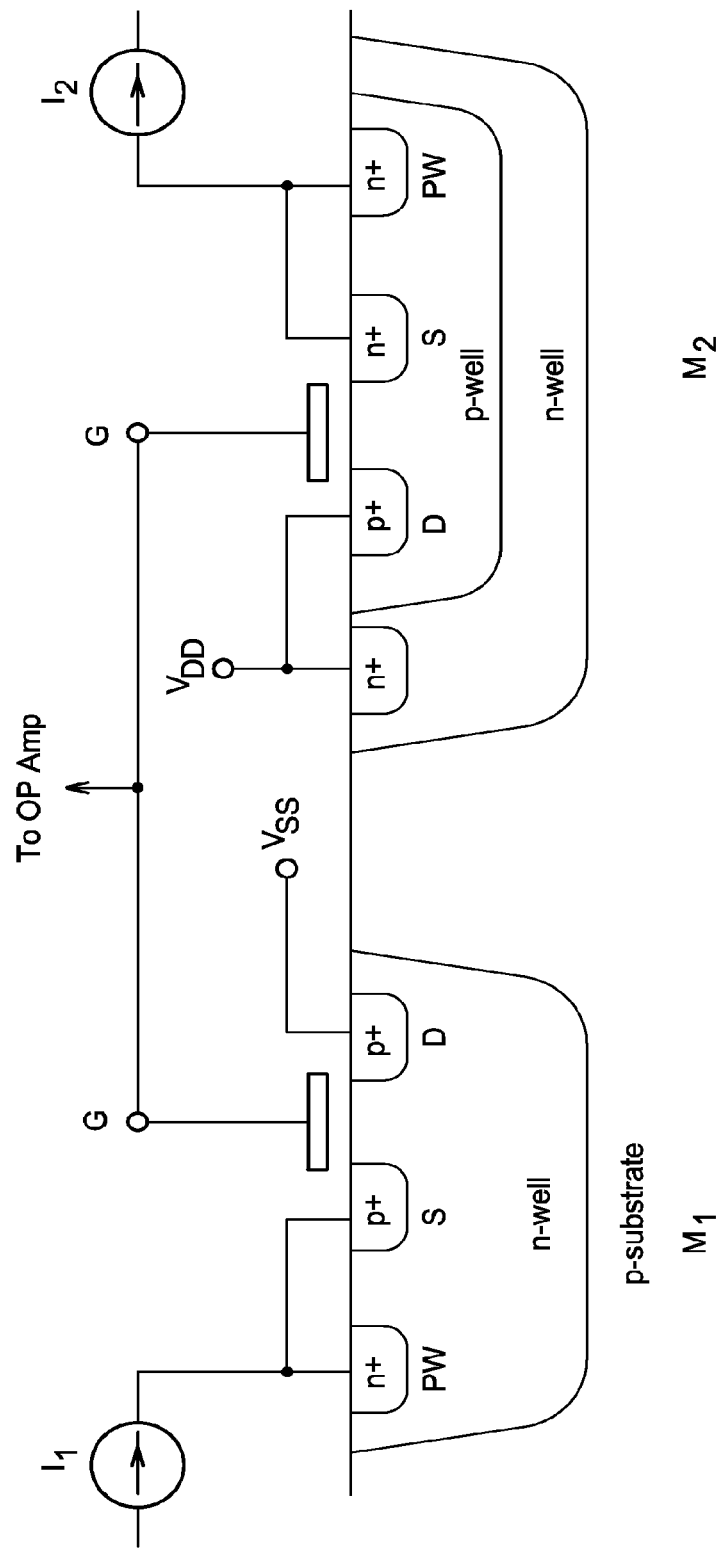
FIG. 10 illustrates an example of a fabrication cross-section of NMOS and PMOS transistors used in source followers serving as level-shifting buffer amplifiers according to one embodiment of the present invention.

Accordingly, other inventive embodiments contemplated herein relate to fabrication of MOS transistors for source followers used in level-shifting buffer amplifiers in which the ratio $g_{mb}/g_m$ is significantly reduced, so as to correspondingly increase the gain of the source followers and thereby significantly reduce the value of the gain error $\epsilon$ of the buffer amplifiers. FIG. 10 provides an illustrative example of such an embodiment based on the circuit example shown in FIG. 8. As shown in FIG. 10, both a PMOS transistor M1 and an NMOS transistor M2 are placed in a separate n-well and a p-well, respectively. The source of M1 is connected to the n-well, and the source of M2 is connected to the p-well. In this case, the incremental source-to-well voltage is zero for both M1 and M2, leading to $g_{mb}=0$. This ensures that the voltage gain of the source followers is appreciably close to unity, and accordingly the gain error $\epsilon$ of buffer amplifiers based on these MOS transistors is significantly small. Alternatively, both M1 and M2 may be manufactured in fully-depleted silicon-on-insulator (SOI) technology, FINFET technology, or floating body transistor technology, which similarly significantly reduce the $g_{mb}/g_m$ ratio.

Figure 11A:
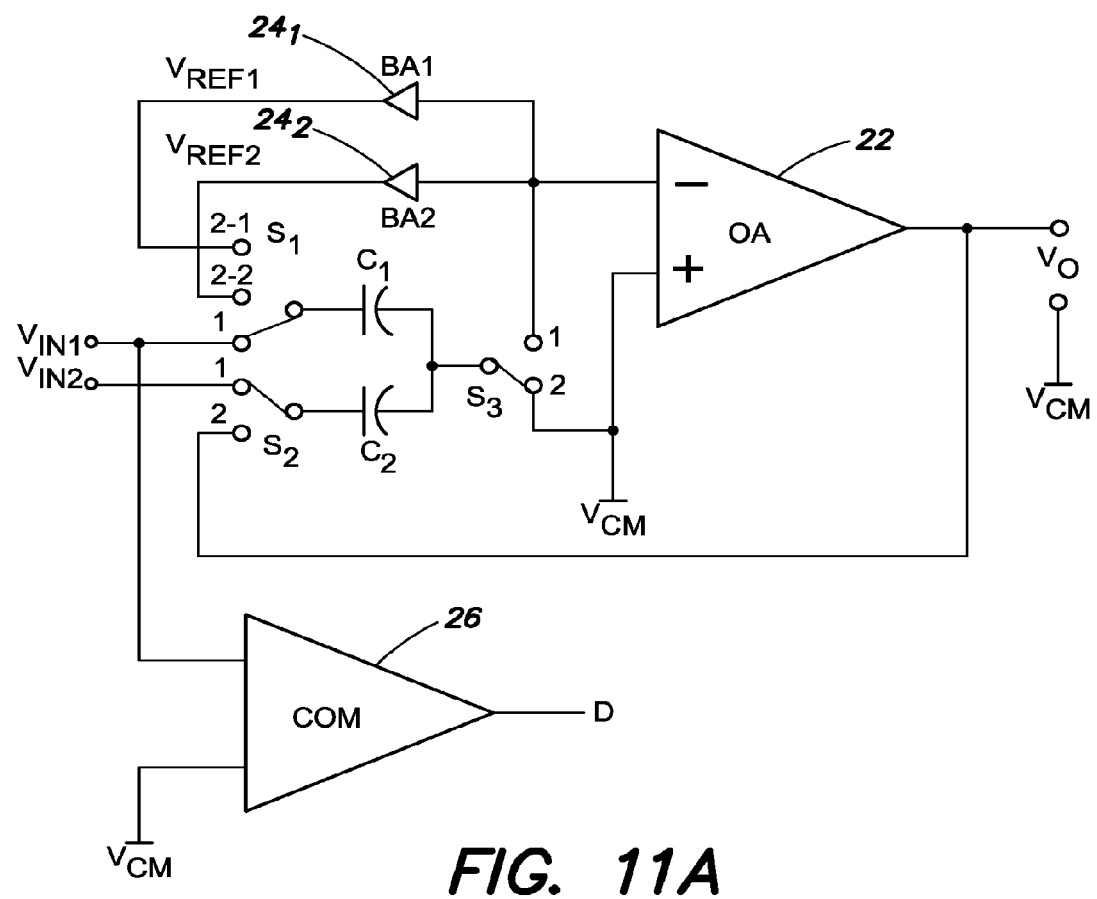
FIG. 11A and FIG. 11B illustrate respective sampling and transfer phases of a switched capacitor circuit including two buffer amplifiers, according to one embodiment of the present invention, in which first and second input voltages may be applied to the circuit during the sampling phase.
Figure 11B:
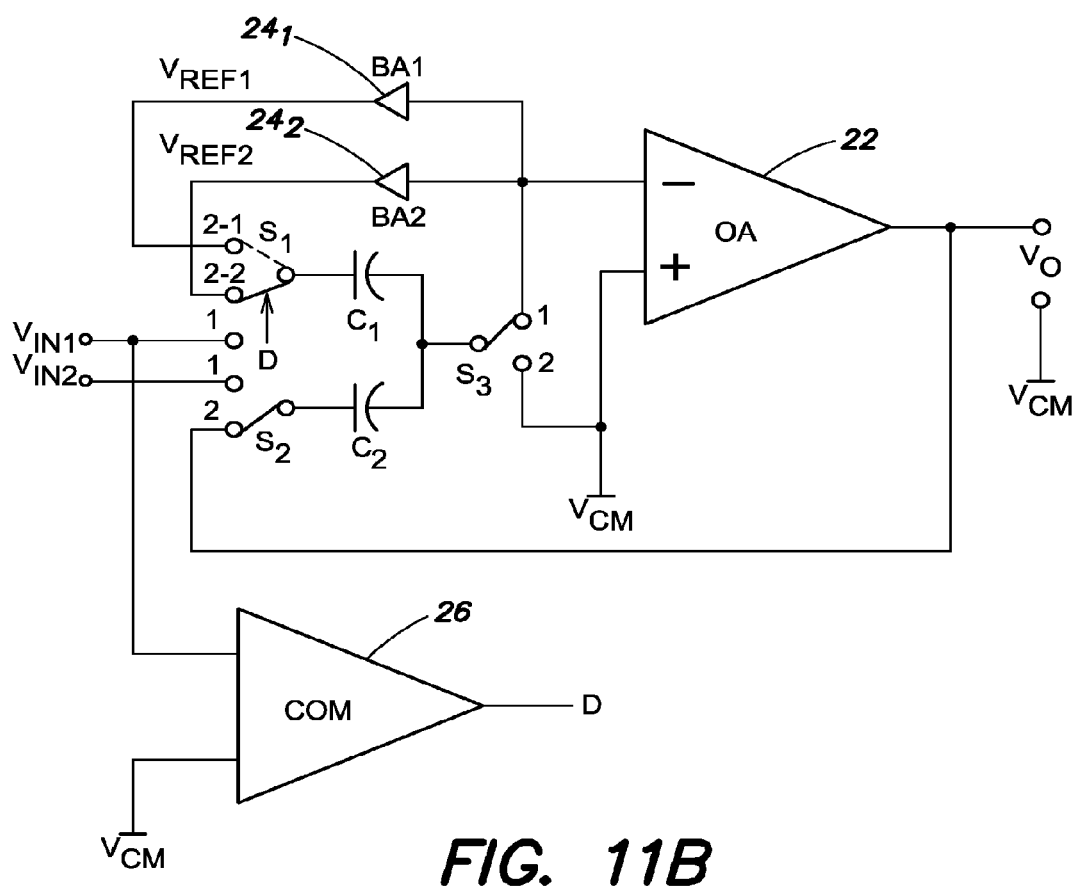

FIG. 11A and FIG. 11B illustrate respective sampling and transfer phases of a switched capacitor circuit including two buffer amplifiers, according to another embodiment of the present invention, in which first and second input voltages may be applied to the circuit during the sampling phase. As in other circuits disclosed herein, the switched capacitor circuit comprises a plurality of switches $S_1$, $S_2$ and $S_3$, at least one input capacitor $C_1$, an integration capacitor $C_2$, a first buffer amplifier $24_1$ (BA1), a second buffer amplifier $24_2$ (BA2), and an operational amplifier 22 (OA). The circuit of FIG. 11A and FIG. 11B also includes a comparator 26 representing a 1-bit flash ADC.

In one aspect of the circuit shown in FIG. 11A, during the sampling phase the plurality of switches are configured to couple a first input voltage $V_{IN1}$ to the at least one input capacitor $C_1$ and a second input voltage $V_{IN2}$ to the integration capacitor $C_2$. This configuration of providing circuit paths for the application of two input voltages during the sampling phase is an alteration with respect to the other circuits discussed herein; however, it should be appreciated that this configuration for providing respective circuit paths for the application of two input voltages during the sampling phase may be implemented in any of the other embodiments discussed herein (e.g., the switched capacitor circuit 100 shown in FIG. 2 and the switched capacitor circuit 150 shown in FIG. 7).

In one implementation in which $V_{IN1}=V_{IN2}$, the sampling phase of the circuit shown in FIG. 11A is functionally equivalent to the sampling phases of other circuits disclosed herein in which $V_{IN1}$ is applied during the sampling phase to both the input capacitor $C_1$ (and other input capacitors if present, e.g., see FIG. 13A and FIG. 13B) and the integration capacitor $C_2$. However, the circuit implementation of FIG. 11A and FIG. 11B affords greater flexibility in some implementations to provide for two different input voltages $V_{IN1}$ and $V_{IN2}$. In this configuration, the general expression for the output voltage $V_O$ is given as:

$$V_O = nV_{IN1} + V_{IN2} - nV_{REF} \quad (16)$$

Accordingly, during the transfer phase shown in FIG. 11B, the plurality of switches are configured to couple the input capacitor, the integration capacitor, and one of the first buffer amplifier and the second buffer amplifier to the operational amplifier to subtract a corresponding one of the first reference voltage and the second reference voltage ($nV_{REF}$) from a sum voltage based on the first input voltage and the second input voltage ($nV_{IN1}+V_{IN2}$) so as to provide an output voltage from the operational amplifier. In various implementations, the first input voltage and the second input voltage may have different absolute values and polarities, respectively, or may have a same absolute value and a same polarity; also, the second input voltage may be a common mode voltage or ground in some implementations.

Figure 12A:
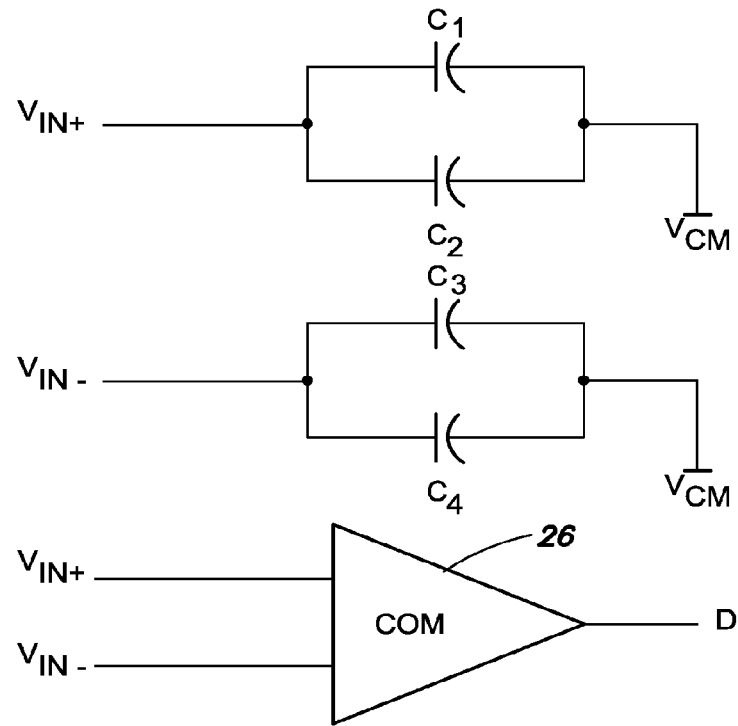
FIG. 12A and FIG. 12B illustrate sample and transfer phases, respectively, of a fully-differential 1-bit per stage pipeline ADC stage including multiple level-shifting buffer amplifiers, according to one embodiment of the present invention.
Figure 12B:
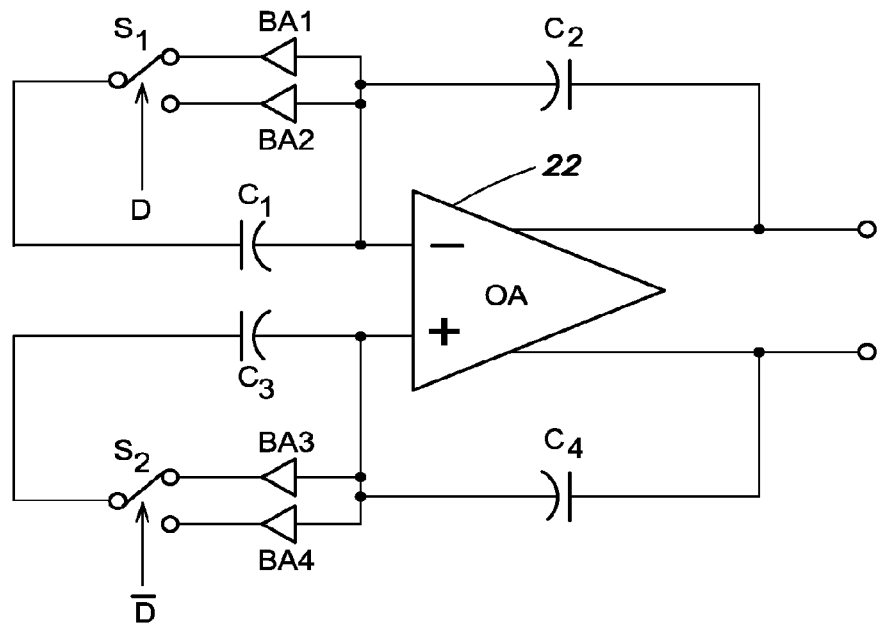

In mixed-signal integrated circuits, fully-differential signal paths are common. In another embodiment shown in FIG. 12A and FIG. 12B, a fully-differential, 1-bit per stage pipeline ADC stage comprises a fully-differential op amp 22 (OA), four capacitors $C_1$-$C_4$, and four level-shifting buffer amplifiers BA1-BA4. In one exemplary implementation, the buffer amplifiers BA1 and BA3 provide a positive level shift $V_{POS}$ and the buffer amplifiers BA2 and BA4 provide a level shift $V_{NEG}$. The amount of level shifts are chosen such that $V_{POS}-V_{NEG}=V_{REF}$ where $V_{REF}$ is the desired reference voltage. During the sampling phase shown in FIG. 12A, the positive input voltage $V_{IN+}$ is sampled on $C_1$ and $C_2$, and the negative input voltage $V_{IN-}$ is sampled on $C_2$ and $C_4$. The comparator 26 (COM) compares $V_{IN+}$ and IN_ and produces an output code D. During the transfer phase shown in FIG. 12B, the capacitor $C_1$ is connected to BA1 or BA2 through a switch S1, and the capacitor $C_3$ is connected to BA3 or BA4 through a switch S2 depending on the comparator output code D. The differential output voltage is given by:

$$V_O = 2(V_{IN+} - V_{IN-}) - D(V_{POS} - V_{NEG}) \quad (16)$$
$$= 2(V_{IN+} - V_{IN-1}) - DV_{REF}$$

Figure 13A:
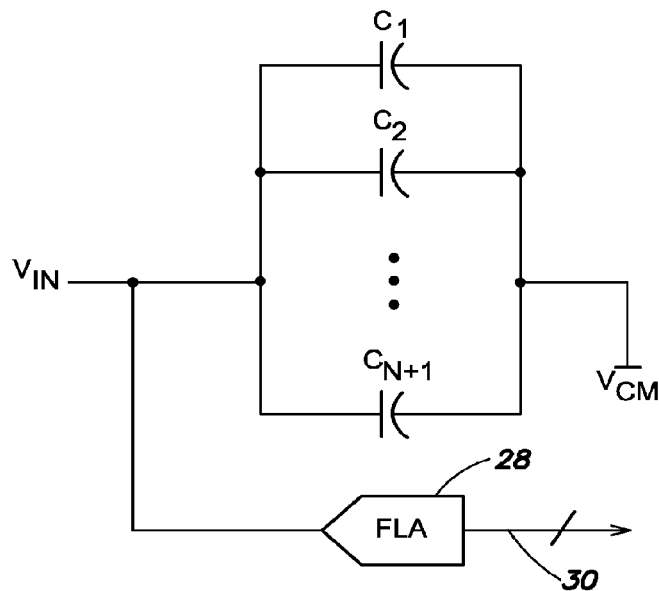
FIG. 13A and FIG. 13B illustrate sample and transfer phases, respectively, of a multi-bit per stage pipeline ADC stage including multiple level-shifting buffer amplifiers, according to one embodiment of the present invention.
Figure 13B:
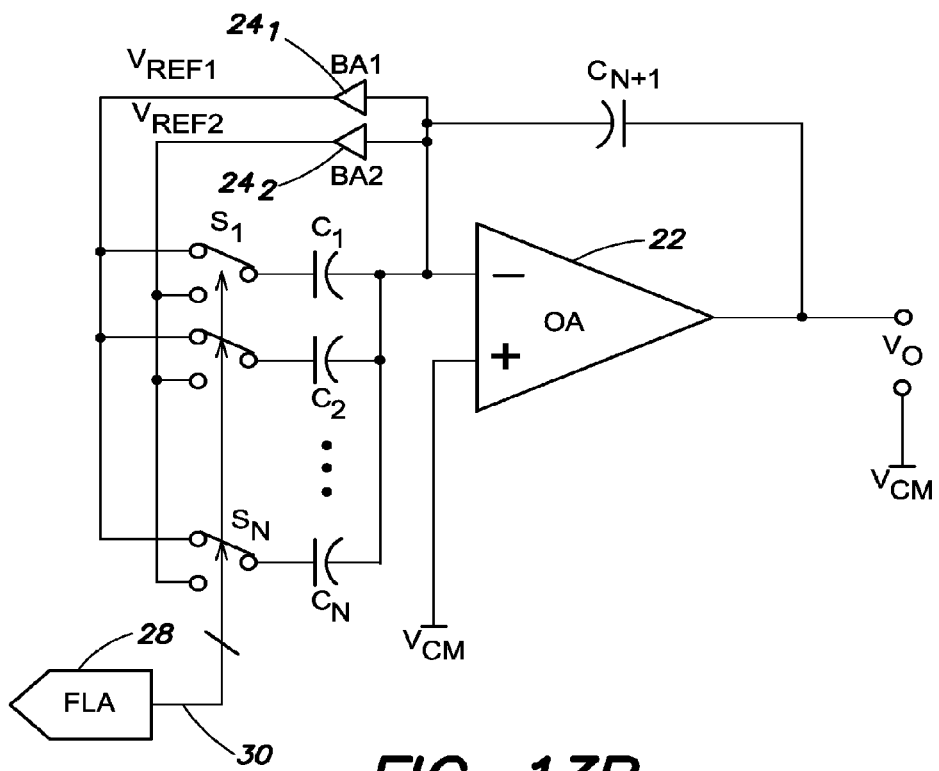

In yet another embodiment shown in FIG. 13A and FIG. 13B, a multi-bit per stage pipeline stage is provided comprising a multi-bit flash ADC 28 (FLA) providing an M-bit digital output code 30, and a plurality of input capacitors $C_1$-$C_N$ that are switched during the transfer phase to one of two buffer amplifiers BA1 or BA2 depending on the flash ADC output code 30. In exemplary implementations, the number N of input capacitors is $2^M-1$ (where M is the number of bits of the digital output code 30). During the sampling phase shown in FIG. 13A, the input voltage $V_{IN}$ is applied similarly across multiple input capacitors $C_1$-$C_N$ and the integration capacitor $C_{N+1}$ arranged in a parallel configuration, and to the FLA 28. During the transfer phase shown in FIG. 13B, a plurality of switches ($S_1$-$S_N$) are operated by the output code 30 of the FLA 28 to couple one or more of the input capacitors $C_1$-$C_N$ to one of the buffer amplifiers $24_1$ and $24_2$ so as to provide a quantized input voltage to be added to or subtracted from the sampled input voltage $V_{IN}$. More specifically, during the transfer phase, at least one of the plurality of input capacitors, the integration capacitor, and the one of the first buffer amplifier and the second buffer amplifier are coupled to the operational amplifier, based at least in part on the M-bit digital output code of the flash ADC FLA 28, to subtract a fraction of the corresponding one of the first reference voltage and the second reference voltage from the input voltage (or sum voltage based on multiple input voltages, as shown in FIG. 11A and FIG. 11B) so as to provide the output voltage from the operational amplifier, wherein the fraction is based at least in part on a digital value of the M-bit digital output code.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments of the invention can be implemented in any of numerous ways. For example, some embodiments may be implemented using hardware, software or a combination thereof. When any aspect of an embodiment is implemented at least in part in software, the software code can be executed on any suitable processor or collection of processors, whether provided in a single computer or distributed among multiple computers.

Also, the technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A switched capacitor circuit operable in a sampling phase and a transfer phase, the switched capacitor circuit comprising:
    a plurality of switches;
    at least one input capacitor;
    an integration capacitor;
    at least one buffer amplifier; and
    an operational amplifier,
wherein:
    during the sampling phase, the plurality of switches are configured to couple a first input voltage to the at least one input capacitor and a second input voltage to the integration capacitor; and
    during the transfer phase, the plurality of switches are configured to couple the at least one input capacitor, the integration capacitor, and the at least one buffer amplifier to the operational amplifier to subtract at least a first reference voltage from a sum voltage based on the first input voltage and the second input voltage so as to provide an output voltage from the operational amplifier, wherein an input of the at least one buffer amplifier is electrically coupled to an input terminal of the operational amplifier during the transfer phase.

2. The circuit of claim 1, wherein at least one of respective absolute values and respective polarities of the first input voltage and the second input voltage are different.

3. The circuit of claim 1, wherein the first input voltage and the second input voltage have a substantially same absolute value and a same polarity.

4. The circuit of claim 1, wherein the second input voltage is one of a common mode voltage and ground.

5. The circuit of claim 1, wherein the sum voltage is based on a multiple n of at least the first input voltage, and the multiple n is based on a ratio of a first capacitance value C1 of the at least one input capacitor and a second capacitance value C2 of the integration capacitor.

6. The circuit of claim 1, wherein:
    the at least one buffer amplifier includes a first buffer amplifier and a second buffer amplifier;
    the first buffer amplifier provides a first offset voltage on which the first reference voltage is based;
    the second buffer amplifier provides a second offset voltage on which a second reference voltage is based; and
    during the transfer phase, the plurality of switches are configured to couple the at least one input capacitor, the integration capacitor, and one of the first buffer amplifier and the second buffer amplifier to the operational amplifier to subtract a corresponding one of the first reference voltage and the second reference voltage from the sum voltage so as to provide the output voltage from the operational amplifier.

7. The circuit of claim 6, wherein the first reference voltage and the second reference voltage have opposite polarities.

8. The circuit of claim 7, wherein the first reference voltage and the second reference voltage have a substantially same absolute value.

9. The circuit of claim 6, further comprising an M-bit flash analog-to-digital converter (ADC) to control at least some of the plurality of switches during the transfer phase, based on the first input voltage, to select the one of the first buffer amplifier and the second buffer amplifier.

10. The circuit of claim 9, wherein:
    during the sampling phase, the first input voltage is applied to an input of the N-bit flash ADC to provide an M-bit digital output code from the M-bit flash ADC based at least in part on the first input voltage; and
    during the transfer phase, the M-bit digital output code controls the at least some of the plurality of switches to select the one of the first buffer amplifier and the second buffer amplifier.

11. The circuit of claim 10, wherein M=1 and the at least one input capacitor includes only a first input capacitor.

12. The circuit of claim 10, wherein:
    M is an integer greater than 1;
    the at least one input capacitor includes a plurality of input capacitors;
    a number N of the plurality of input capacitors is equal to 2M−1; and
    during the transfer phase, the at least some of the plurality of switches are controlled by the M-bit digital output code of the flash ADC to couple at least one of the plurality of input capacitors, the integration capacitor, and the one of the first buffer amplifier and the second buffer amplifier to the operational amplifier to subtract a fraction of the corresponding one of the first reference voltage and the second reference voltage from the sum voltage so as to provide the output voltage from the operational amplifier, wherein the fraction is based at least in part on a digital value of the M-bit digital output code.

13. The circuit of claim 1, further comprising:
    at least one second input capacitor;
    a second integration capacitor; and
    at least one second buffer amplifier,
wherein:
    the plurality of switches are operated to configure the operational amplifier in a differential mode;
    during the sampling phase, the plurality of switches are further configured to couple an opposite polarity copy of the first input voltage to the at least one second input capacitor; and
    during the transfer phase, the plurality of switches are further configured to couple the at least one second input capacitor, the second integration capacitor, and the at least one second buffer amplifier to the operational amplifier to subtract at least the first reference voltage from the sum voltage so as to provide the output voltage from the operational amplifier.

14. The circuit of claim 1, wherein the first reference voltage is based at least in part on a first offset voltage of the at least one buffer amplifier.

15. The circuit of claim 14, wherein the at least one buffer amplifier includes a source follower circuit configuration.

16. The circuit of claim 15, wherein the source follower circuit configuration includes at least one MOS transistor, and wherein the first offset voltage is based at least in part on a gate-source voltage of the at least one MOS transistor.

17. The circuit of claim 16, wherein:
the source follower circuit configuration further includes at least one level-shifting capacitor and at least one level-shifting switch;
during the sampling phase, the at least one level-shifting switch is configured to couple the at least one level-shifting capacitor to a level-shift voltage;
during the transfer phase, the at least one level-shifting switch is configured to couple the at least one level-shifting capacitor to a gate of the at least one MOS transistor; and
the first offset voltage is based at least in part on the gate-source voltage of the at least one MOS transistor and the level shift voltage.

18. The circuit of claim 16, wherein the at least one MOS transistor includes a matched-pair of MOS transistors.

19. The circuit of claim 16, wherein:
the at least one buffer amplifier includes:
a first level-shifting buffer amplifier including a first MOS transistor to provide the first offset voltage on which the first reference voltage is based; and
a second level-shifting buffer amplifier including a second MOS transistor to provide a second offset voltage on which a second reference voltage is based;
during the transfer phase, the plurality of switches are configured to couple the at least one input capacitor, the integration capacitor, and one of the first MOS transistor the second MOS transistor to the operational amplifier to subtract a corresponding one of the first reference voltage and the second reference voltage from the sum voltage so as to provide the output voltage from the operational amplifier; and
one of the first MOS transistor and the second MOS transistor is an NMOS transistor and another of the first MOS transistor and the second MOS transistor is a PMOS transistor, such that the first reference voltage and the second reference voltage have opposite polarities.

20. The circuit of claim 19, wherein:
the NMOS transistor is fabricated in a p-type well;
the PMOS transistor is fabricated in an n-type well separate from the p-type well;
a source of the PMOS transistor is electrically coupled to the n-type well; and
a source of the NMOS transistor is electrically coupled to the p-type well.

21. A charge transfer method, comprising:
A) sampling at least one input voltage during a sampling phase; and
B) subtracting, using an operational amplifier, at least a first reference voltage from the at least one input voltage during a transfer phase, the first reference voltage being provided by at least one buffer amplifier,
wherein A) and B) are performed using a same set of at least two capacitors for both the sampling phase and the transfer phase,
wherein the at least one input voltage comprises a first input voltage and a second input voltage, the at least two capacitors include at least one input capacitor and an integration capacitor, and wherein:
A) comprises coupling the first input voltage to the at least one input capacitor and the second input voltage to the integration capacitor; and
B) comprises coupling the at least one input capacitor, the integration capacitor, and the at least one buffer amplifier to the operational amplifier to subtract at least the first reference voltage from a sum voltage based on the first input voltage and the second input voltage so as to provide an output voltage from the operational amplifier.

22. The method of claim 21, wherein at least one of respective absolute values and respective polarities of the first input voltage and the second input voltage are different.

23. The method of claim 21, wherein the first input voltage and the second input voltage have a substantially same absolute value and a same polarity.

24. The method of claim 21, wherein the second input voltage is one of a common mode voltage and ground.

25. The method of claim 21, wherein the sum voltage is based on a multiple n of at least the first input voltage, and the multiple n is based on a ratio of a first capacitance value C1 of the at least one input capacitor and a second capacitance value C2 of the integration capacitor.

26. The method of claim 21, wherein:
the at least one buffer amplifier includes a first buffer amplifier and a second buffer amplifier;
the first buffer amplifier provides a first offset voltage on which the first reference voltage is based;
the second buffer amplifier provides a second offset voltage on which a second reference voltage is based; and
B) comprises coupling the at least one input capacitor, the integration capacitor, and one of the first buffer amplifier and the second buffer amplifier to the operational amplifier to subtract a corresponding one of the first reference voltage and the second reference voltage from the sum voltage so as to provide the output voltage from the operational amplifier.

27. The method of claim 26, wherein the first reference voltage and the second reference voltage have opposite polarities.

28. The method of claim 27, wherein the first reference voltage and the second reference voltage have a substantially same absolute value.

29. The method of claim 26, wherein:
A) further comprises coupling the first input voltage to an M-bit flash analog-to-digital converter (ADC) to provide an M-bit digital output code from the M-bit flash ADC based at least in part on the first input voltage; and
B) further comprises select the one of the first buffer amplifier and the second buffer amplifier based at least in part on the M-bit digital output code.

30. The method of claim 29, wherein M=1 and the at least one input capacitor includes only a first input capacitor.

31. The method of claim 29, wherein:
M is an integer greater than 1;
the at least one input capacitor includes a plurality of input capacitors;
a number N of the plurality of input capacitors is equal to 2M−1; and
B) further comprises coupling, based at least in part on the M-bit digital output code, at least one of the plurality of input capacitors, the integration capacitor, and the one of the first buffer amplifier and the second buffer amplifier to the operational amplifier to subtract a fraction of the corresponding one of the first reference voltage and the second reference voltage from the sum voltage so as to provide the output voltage from the operational amplifier, wherein the fraction is based at least in part on a digital value of the M-bit digital output code.

32. The method of claim 21, wherein:
A) further comprises coupling an opposite polarity copy of the first input voltage to at least one second input capacitor; and
B) further comprises coupling the at least one second input capacitor, a second integration capacitor, and at least one second buffer amplifier to the operational amplifier to subtract at least the first reference voltage from the sum voltage based on the first input voltage and the second input voltage so as to provide the output voltage from the operational amplifier.

33. The method of claim 21, wherein the first reference voltage is based at least in part on a first offset voltage of the at least one buffer amplifier.

34. The method of claim 33, wherein the at least one buffer amplifier includes a source follower circuit configuration.

35. The method of claim 34, wherein the source follower circuit configuration includes at least one MOS transistor, and wherein the first offset voltage is based at least in part on a gate-source voltage of the at least one MOS transistor.

36. The method of claim 35, wherein:
the source follower circuit configuration further includes at least one level-shifting capacitor;
A) further comprises coupling the at least one level-shifting capacitor to a level-shift voltage;
B) further comprises coupling the at least one level-shifting capacitor to a gate of the at least one MOS transistor; and
the first offset voltage is based at least in part on the gate-source voltage of the at least one MOS transistor and the level shift voltage.

37. The method of claim 35, wherein the at least one MOS transistor includes a matched-pair of MOS transistors.

38. The method of claim 35, wherein:
the at least one buffer amplifier includes:
a first level-shifting buffer amplifier including a first MOS transistor to provide the first offset voltage on which the first reference voltage is based; and
a second level-shifting buffer amplifier including a second MOS transistor to provide a second offset voltage on which a second reference voltage is based;
B) comprises coupling the at least one input capacitor, the integration capacitor, and one of the first MOS transistor the second MOS transistor to the operational amplifier to subtract a corresponding one of the first reference voltage and the second reference voltage from the sum voltage so as to provide the output voltage from the operational amplifier; and
one of the first MOS transistor and the second MOS transistor is an NMOS transistor and another of the first MOS transistor and the second MOS transistor is a PMOS transistor, such that the first reference voltage and the second reference voltage have opposite polarities.

39. The method of claim 38, wherein:
the NMOS transistor is fabricated in a p-type well;
the PMOS transistor is fabricated in an n-type well separate from the p-type well;
a source of the PMOS transistor is electrically coupled to the n-type well; and
a source of the NMOS transistor is electrically coupled to the p-type well.

40. A stage of a pipeline or algorithmic analog-to-digital converter, the stage comprising:
a plurality of switches;
at least one input capacitor;
an integration capacitor;
a first buffer amplifier to provide a first offset voltage on which a first reference voltage is based;
a second buffer amplifier to provide a second offset voltage on which a second reference voltage is based;
an M-bit flash analog-to-digital converter to control at least some of the plurality of switches during the transfer phase; and
an operational amplifier,
wherein:
a number N of the at least one input capacitor is equal to $2M-1$;
during the sampling phase:
1) the plurality of switches are configured to couple a first input voltage to the at least one input capacitor and a second input voltage to the integration capacitor; and
2) the first input voltage is applied to an input of the M-bit flash ADC to provide an M-bit digital output code from the M-bit flash ADC based at least in part on the first input voltage; and
during the transfer phase:
1) the plurality of switches are configured to couple at least one of the at least one input capacitor, and to couple the integration capacitor and one of the first buffer amplifier and the second buffer amplifier, to the operational amplifier to subtract a fraction of a corresponding one of the first reference voltage and the second reference voltage from a sum voltage based on the first input voltage and the second input voltage so as to provide an output voltage from the operational amplifier, wherein the fraction is based at least in part on a digital value of the M-bit digital output code; and
2) the M-bit digital output code from the M-bit flash ADC controls at least some of the plurality of switches to select the one of the first buffer amplifier and the second buffer amplifier.

41. The stage of claim 40, wherein at least one of respective absolute values and respective polarities of the first input voltage and the second input voltage are different.

42. The stage of claim 40, wherein the first input voltage and the second input voltage have a substantially same absolute value and a same polarity.

43. The stage of claim 40, wherein the second input voltage is one of a common mode voltage and ground.

44. The stage of claim 40, wherein the sum voltage is based on a multiple n of at least the first input voltage, and the multiple n is based on a ratio of a first capacitance value C1 of the at least one input capacitor and a second capacitance value C2 of the integration capacitor.

* * * * *